United States Patent
Venk et al.

(10) Patent No.: US 10,088,116 B2
(45) Date of Patent: Oct. 2, 2018

(54) LIGHTING DEVICE WITH PLURALITY OF STRIPS BENDABLE RELATIVE TO EACH OTHER AND CORRESPONDING METHOD

(71) Applicant: OSRAM GmbH, Munich (DE)

(72) Inventors: Sridharan Venk, Treviso (IT); Dina Pasqualini, Udine (IT); Alessandro Scordino, Dolo (IT)

(73) Assignee: OSRAM GmbH, Munich (DE)

( * ) Notice: Subject to any disclaimer, the term of this patent is extended or adjusted under 35 U.S.C. 154(b) by 141 days.

(21) Appl. No.: 15/147,945

(22) Filed: May 6, 2016

(65) Prior Publication Data
US 2016/0327223 A1 Nov. 10, 2016

(30) Foreign Application Priority Data
May 8, 2015 (IT) .......................... 102015000014297

(51) Int. Cl.
*H01L 27/15* (2006.01)
*F21S 8/00* (2006.01)
(Continued)

(52) U.S. Cl.
CPC .............. *F21S 8/00* (2013.01); *H01L 27/153* (2013.01); *H01L 27/156* (2013.01); *H05K 1/028* (2013.01); *H05K 1/056* (2013.01); *H05K 1/189* (2013.01); *F21Y 2103/10* (2016.08); *F21Y 2115/10* (2016.08); *H05K 2201/09036* (2013.01); *H05K 2201/09063* (2013.01); *H05K 2201/10106* (2013.01)

(58) Field of Classification Search
CPC ...... H05K 1/028; H05K 1/189; H01L 27/153; H01L 27/156; F21Y 2107/70; F21Y 2105/12; F21Y 2105/14; F21Y 2105/16; F21Y 2103/10; F21Y 2103/20; F21S 4/20–4/24; F21S 4/28
See application file for complete search history.

(56) References Cited

U.S. PATENT DOCUMENTS

| | | | | |
|---|---|---|---|---|
| 6,508,564 B1 * | 1/2003 | Kuwabara | ............ | G02B 6/0068 362/559 |
| 2006/0221609 A1 * | 10/2006 | Ryan, Jr. | ................... | F21K 9/00 362/238 |

(Continued)

FOREIGN PATENT DOCUMENTS

| | | |
|---|---|---|
| JP | 2007115577 A | 5/2007 |
| WO | 2013094950 A1 | 6/2013 |
| WO | 2014177625 A1 | 11/2014 |

OTHER PUBLICATIONS

Italian Search Report based on Application No. 102015000014297(8 Pages) dated Jan. 12, 2016 (Reference Purpose Only).

Primary Examiner — Anh Mai
Assistant Examiner — Steven Horikoshi
(74) Attorney, Agent, or Firm — Viering, Jentschura & Partner (57) ABSTRACT

A lighting device includes a laminar support member bendable at bending lines extending in a common direction, the bending lines partitioning the laminar support member in a plurality of stripes. The plurality of stripes includes at least one first stripe with electrically-powered light radiation sources therealong and at least one second stripe free from light radiation sources forming a side wing for the at least one first stripe.

12 Claims, 9 Drawing Sheets

(51) Int. Cl.
   *H05K 1/02* (2006.01)
   *H05K 1/05* (2006.01)
   *H05K 1/18* (2006.01)
   *F21Y 103/10* (2016.01)
   *F21Y 115/10* (2016.01)

(56) References Cited

U.S. PATENT DOCUMENTS

| | | | |
|---|---|---|---|
| 2008/0271913 A1 | 11/2008 | Enomoto et al. | |
| 2012/0228659 A1* | 9/2012 | Hsu | H01L 33/60 257/98 |
| 2013/0003373 A1* | 1/2013 | Hamby | F21V 23/06 362/249.02 |
| 2013/0051023 A1* | 2/2013 | Huang | F21V 17/06 362/249.14 |
| 2014/0334147 A1 | 11/2014 | Bhattarai et al. | |
| 2015/0117001 A1 | 4/2015 | Fan | |
| 2015/0192961 A1* | 7/2015 | Zhou | G06F 1/1652 428/120 |
| 2016/0088721 A1* | 3/2016 | Sepkhanov | H05K 1/0277 362/296.01 |

\* cited by examiner

LIGHTING DEVICE WITH PLURALITY OF STRIPS BENDABLE RELATIVE TO EACH OTHER AND CORRESPONDING METHOD

CROSS-REFERENCE TO RELATED APPLICATION

This application claims priority to Italian Patent Application Serial No. 102015000014297, which was filed May 8, 2015, and is incorporated herein by reference in its entirety.

TECHNICAL FIELD

The present description relates to lighting devices.

One or more embodiments may refer to lighting devices employing electrically-powered solid-state light radiation sources, e.g. LED sources.

BACKGROUND

In the field of solid-state lighting devices, e.g. LED modules, various solutions are known employing flexible support structures.

We may mention for instance the products sold under the trade mark Osram Linear Flex by companies of the Applicants' corporation, or the product sold under the trade mark Matrix Platform by Philips Lumileds. These are linearly shaped modules wherein the presence of a flexible substrate offers a good level of flexibility both in design and application. The assembly may be implemented, for example, by applying an adhesive material on the back side of the device.

From the range of products of SeeLuce (Korea) LED modules are known which are very thin and lightweight, and which exhibit high flexibility. The product is available in various shapes and may be used, for example, for indoor lighting, general lighting applications and architectural lighting. In the production of the company CoolEdge Lighting Inc., Richmond (Canada), LED modules are known having the shape of linear or square sheets.

Such products may be considered as generally conventional solutions from the point of view of design, and are destined mainly to linear applications. Their flexibility, actually, enables to broaden the application field to curved or rounded surfaces. Moreover, beside their flexibility, they have on the whole conventional features in their structure, also as far as the optical appearance is concerned. This also true in the case of support members including square or possibly circular shaped sheets, which enable to widen the possible application range. In this case, too, although they exhibit flexibility and good form factor characteristics, these products do not offer outstanding features as regards design, even when particularly thin substrates are used (e.g. 50 µm thin) and/or the base materials include resins such as PET or PI.

Various solutions may include, as a cover material, a so-called solder mask material. These are generally acrylic materials which however limit the support reflectivity. This feature may be a disadvantage e.g. in indoor lighting, where high efficiencies are desirable.

Beside flexibility, another feature common to these conventional products is that the light emission distribution is basically equal to the distribution of light sources. This is a limiting factor in some applications (for example in architectural lighting). However, in other applications such as indoor lighting (offices, shops, industrial hangars, etc.) the light radiation distribution may have to meet needs that the light radiation source in itself is unable to fulfil. In this case, the shaping of light radiation distribution may be achieved through the luminaire, e.g. via secondary optics included in the luminaire itself.

Such lighting devices may include three or more components, e.g. a (metal) body, a light engine and diffusers/secondary optics adapted to shape the light radiation emitted by the light engine.

The need is therefore felt to provide lighting devices adapted to employ electrically-powered solid-state light radiation sources, e.g. LED sources, which may allow for a broad range of optical configurations, without involving a complex structure and/or manufacturing method. Moreover, the need is felt to achieve high reflectivity in the light engine support member, and therefore a high lighting efficiency.

SUMMARY

A lighting device includes a laminar support member bendable at bending lines extending in a common direction, said bending lines partitioning said laminar support member in a plurality of stripes. Said plurality of stripes includes at least one first stripe with electrically-powered light radiation sources therealong and at least one second stripe free from light radiation sources forming a side wing for said at least one first stripe.

BRIEF DESCRIPTION OF THE DRAWINGS

One or more embodiments will now be described, by way of non-limiting example only, with reference to the annexed figures, wherein:

FIGS. 6 and 7, wherein

DESCRIPTION

It will be appreciated that, for ease of understanding, the views in the various figures may not be drawn to the same scale.

In the following description, numerous specific details are given to provide a thorough understanding of one or more exemplary embodiments. One or more embodiments may be practiced without one or several specific details, or with other methods, components, materials, etc. In other instances, well-known structures, materials, or operations are not shown or described in detail to avoid obscuring various aspects of the embodiments.

Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings provided herein are for convenience only, and therefore do not interpret the extent of protection or meaning of the embodiments.

In the figures, reference 10 denotes on the whole a lighting device employing electrically-powered light radiation sources. In one or more embodiments, the sources may be solid-state light radiation sources, such as LED sources.

In one or more embodiments, light radiation sources L may be arranged on a laminar support member 12 substantially similar to a Printed Circuit Board (PCB). In one or more embodiments, the laminar support member may be flexible, as in the case of what is currently named Flexible Printed Circuit (FPC).

In one or more embodiments, laminar support member may have any shape (rectangular, square, circular, mixtilinear). In the same way, LEDs L may be of various kinds (discrete, CoB, . . . ) as needed, and they may be arranged on support member 12 (on one or both sides thereof) according to various configurations.

In one or more embodiments, LEDs L may be arranged on support member 12 in linear arrays (i.e. in rows), so that when device 10 is viewed in cross-section (i.e. along axis x of FIG. 1), it is possible to discern, in support member 12, stripes or bands which are co-extensive with the aligning direction of LEDs L, wherein there are comprised:
"functional" or "active" stripes or bands 121, on which LEDs L are arranged, and
so-called "passive" or "dummy" stripes (which in the following are also called "wings") without LEDs L.

In one or more embodiments, dummy areas or wings 122 may be completely passive because, although they may include electrically conductive metallic (e.g. copper) layers, they may be totally free from lines for transferring electrical signals, or ground lines or power supply lines, which on the contrary are present in the active stripes or bands 121, which may also include corresponding connectors (not visible in the figures), e.g. "wago connectors". It will be appreciated that such complete passivity of stripes or bands 122 is not however a mandatory feature.

Figure 2:
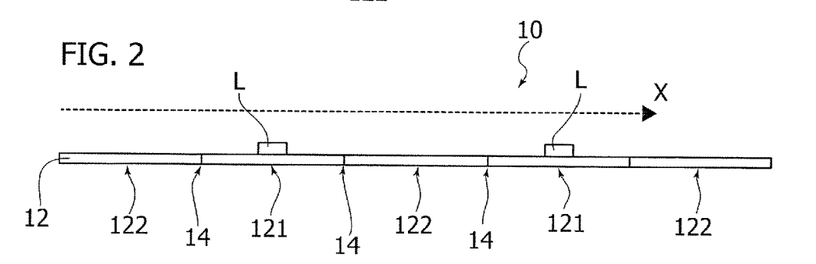
FIG. 2 is a section along line II-II of FIG. 1.

Stripes or bands 121, 122 are separated from each other by folding lines 14, which may be distributed according to different patterns, e.g. so that stripes or bands 121, 122 have the same width in the direction of transverse axis x, as exemplified in FIG. 2, or different lengths.

Figure 3:
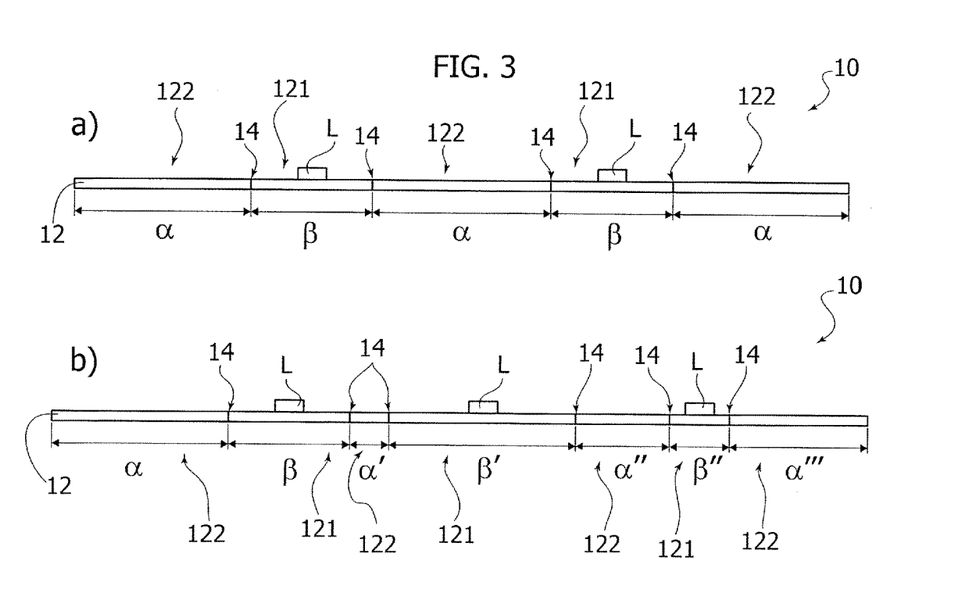
FIG. 3, including two parts respectively denoted as a) and b), exemplifies possible embodiments of a device as shown in FIG. 1.

The two parts of FIG. 3, respectively denoted as a) and b), exemplify possible different widths, so that:
wings 122 have a width α which α is different from width β of functional or active stripes or bands 121, the values α and β being equal for all the stripes or bands of the same type-part a) of FIG. 3,
among stripes of the same kind or nature there may be present widths α, α', α", α''' and β, β', β" which are different from one another—part b) of FIG. 3.

In one or more embodiments, the sizes both of active or functional bands or stripes 121 and of dummy bands or stripes, or "wings" 122 may be chosen according to the particular application needs.

Figure 4:
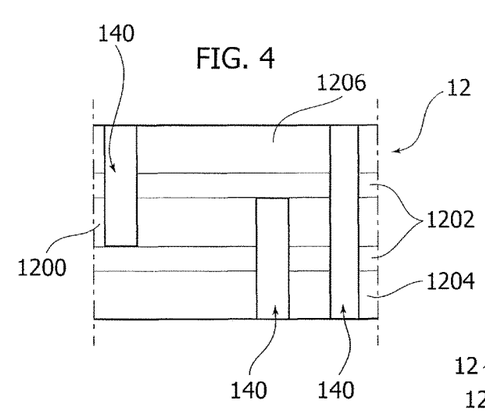
FIGS. 4 and 5 are cross-sections of a detail of a laminar support member which may be used in a device according to one or more embodiments.
Figure 5:
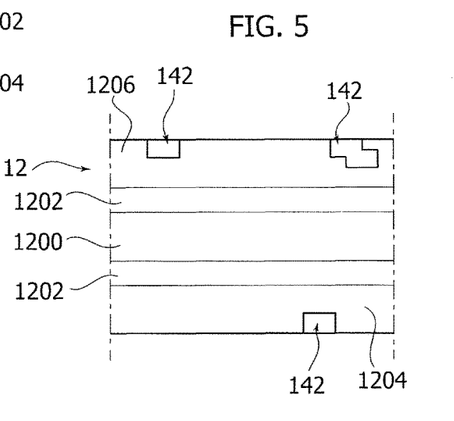

FIG. 4 and FIG. 5 exemplify possible implementations of laminar support member 12. In one or more embodiments, this may be implemented according to solutions currently employed to manufacture Flexible Printed Circuits (FPCs).

In one or more embodiments, support member 12 may have a metallic (e.g. copper) core layer 1200, on the opposed sides whereof there may be applied, e.g. with intermediate adhesive layers 1202, a base layer 1204 and a cover or coating layer 1206.

In one or more embodiments, base layer 1204 and cover layer 1206 may include polymer materials such as PE (polyethylene), PET (polyethylene terephthalate) or PI (polyimide). As regards the thickness of said polymer layers, in one or more embodiments thicknesses can be chosen in a range from tens of microns to hundreds of microns, with materials currently available.

Such indications of amounts are of course merely exemplary and non-limiting: one or more embodiments may envisage the use of materials and/or thicknesses which are different from what has previously been stated in a merely exemplary way.

Laminar structures as exemplified in FIGS. 4 and 5 may be bent once or several times along their whole section or part thereof, e.g. through thermoforming, through plastic deformation, or through plastic deformations triggered by modifications to the laminar structure itself (e.g. the plastic deformation may be triggered by cuts in the laminar structure, in order to prevent the system from loosening after bending).

In one or more embodiments, in order to form bending lines 14 between stripes or bands 121, 122, various solutions can be resorted to as exemplified in FIG. 4 and FIG. 5.

In one or more embodiments, such lines may be substantially implemented as "creasing" lines, i.e. as rows of holes 140 extending through substrate 12. In one or more embodiments, they may consist of blind or through holes.

For example, in one or more embodiments the holes may extend through core layer 1200, and:
cover layer 1206 and related adhesive layer 1202 (such a situation is exemplified on the right of FIG. 4),
base layer 1204 and related adhesive layer 1202 (such a situation is exemplified in the middle of FIG. 4), and both base layer 1204 and cover layer 1206, together with the associated adhesive layers 1202 (such a situation is shown on the right in FIG. 4).

The examples in FIG. 5 refer to the possible presence of so-called "kiss cuts", i.e. shallow cuts affecting only base layer 1204 and/or cover layer 1206, which do not penetrate core layer 1200.

The choice of either solution may depend on various reasons, such as the intrinsic properties and/or the thicknesses of the involved materials.

The possible presence of kiss cuts as exemplified in FIG. 5 (which may be used in combination with the holes exemplified in FIG. 4) may facilitate the bending of support member 12 even at room temperature at bending lines 14.

In addition to facilitating the bending operation, the kiss cuts (substantially a partial cut of base layer 1204 and/or of cover layer 1206) may moreover assist in retaining the deformed shape, so that after bending support member 12 does not tend to recover the original flat configuration.

As exemplified herein, holes 140 and kiss cuts 142 may be located (as will be better detailed in the following) at positions which correspond exactly to folding lines 14, specifically having the bending lines matching the axes of the holes/cuts. Such a solution, however, is not strictly mandatory.

Figure 6:
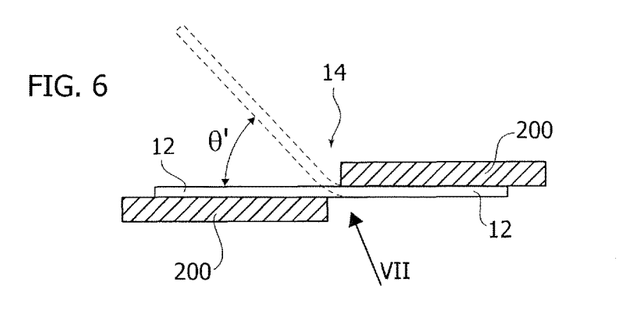
Figure 7:
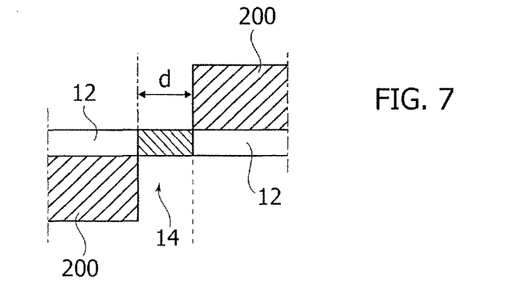
FIG. 7 is an enlarged view of the part of FIG. 6 marked by arrow VII, show possible criteria to bend a device according to one or more embodiments.

FIG. 6 and FIG. 7 show possible operations to be performed in order to bend a support member 12 at a bending line 14, whatever the location and the specific implementation thereof.

In one or more embodiments, a corresponding bending fixture may include two vacuum plates 200 (known in themselves) adapted to be applied (preferably on opposed faces) to support 12 on either side of bending line 14.

Plates 200 may be adapted to perform a relative motion, e.g. one of them (shown on the right of FIG. 6, for example) keeping the fixed position while the other (shown on the left in FIG. 6) swinging upwards by an angle θ', as exemplified by the dashed lines in FIG. 6, thus leading to a corresponding bending of support member 12 at bending line 14.

According to known criteria, in order to take into account the springback of the material of support member 12, the bending angle may be chosen so that it amounts to θ'=θ+Δθ, wherein θ is the final bending value and Δθ takes into account the springback of the material.

FIG. 7 exemplifies that, in one or more embodiments, the mutually opposed edges of both bending plates 200 may be spaced by a gap d, adapted to amount to 0.5-2 mm according to the specific features (laminar structure, materials, thicknesses, etc.) of support member 12.

Figures 8, 9, 10, 11:
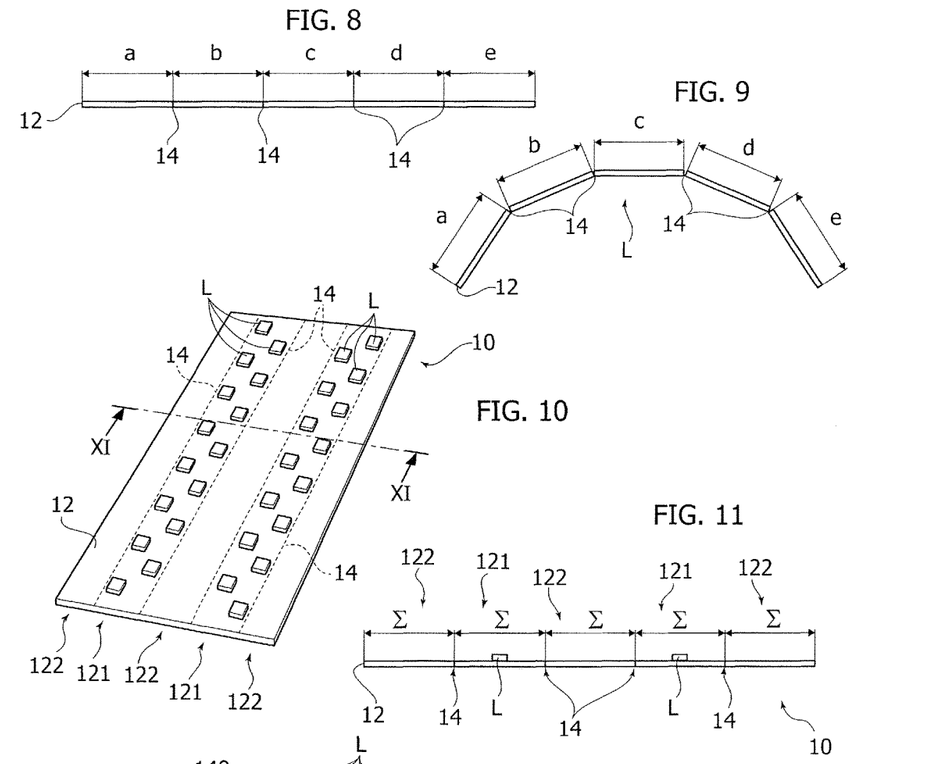
FIGS. 8 and 9 show possible results which may be achieved through the bending operation of FIG. 6 and FIG. 7.
FIGS. 10 and 11, the latter substantially corresponding to a cross-section view along line XI-XI of FIG. 10, show possible modifications of one or more embodiments.

FIG. 8 and FIG. 9 exemplify the fact that the bending operations shown in FIG. 6 and FIG. 7, as regards two portions of support member 12 which are separated by a bending line 14, may be extended to a support member 12 including a plurality of bands or stripes a, b, c, d, e (either "functional" stripes 121 or wings 122) e.g. in order to obtain, from a flat support member as exemplified in FIG. 8, a curved tile-shaped support member, as shown in FIG. 9.

Such a result may be obtained in different ways.

In a merely exemplary solution, it is possible to keep stripes c, d and e initially fixed, and to perform bending in the following order:
    band or stripe b,
    band or stripe a,
    band or stripe d, and
    band or stripe e.

As a further example, it is possible to keep bands or stripes b, c, d, and e initially fixed, and to perform bending in the following sequence:
    band or stripe a,
    band or stripe b,
    band or stripe d, and
    band or stripe e.

It will be appreciated that, in the case of an erroneous bending, the latter may be corrected by bringing support member 12 back to the initial flat configuration, and by repeating the bending procedure in the correct way.

The general criteria previously exemplified may be applied to a wide range of possible embodiments. This may concern both the distribution of bands or stripes 121, 122 and the distribution of LEDs L on functional bands or stripes 121, and also the implementation of bending lines 14 (holes 140 and kiss cuts 142).

For example, FIG. 10 exemplifies a device 10 including three wings 122, alternating with functional bands or stripes 121, each of which exhibits a zig-zag array of LEDs L. As it is visible in the view of FIG. 11, stripes 121, 122 may have either the same width Σ, or different widths.

As previously stated, support member 12 may have a layered structure, such as schematically shown in FIG. 4 and FIG. 5, e.g. with a reflective cover layer 1206, including e.g. a white material.

Figure 12:
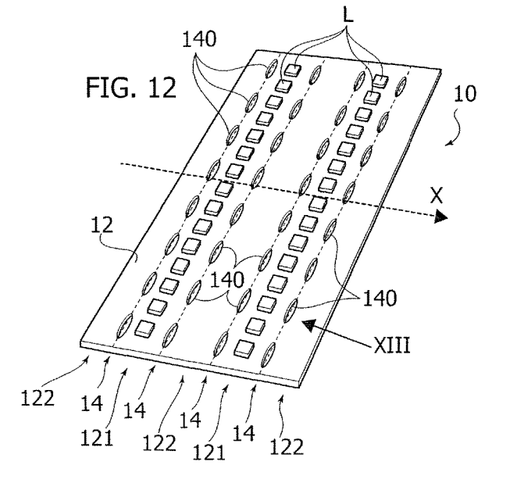
FIG. 12 shows in further detail possible implementations of one or more embodiments.
Figure 13:
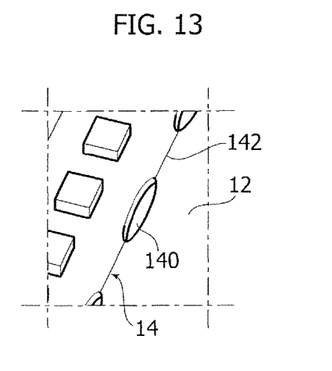
FIG. 13 shows in an enlarged view the part of FIG. 12 marked by arrow XIII.

FIG. 12 and FIG. 13 exemplify various possibilities to implement bending lines 14 e.g. with the presence of (either blind or through) holes 140 of a circular, oval or elliptical shape, e.g. with a major axis "a", which is parallel to the direction of the respective bending line 14, and a minor axis "b" which is transverse to such a direction.

Whatever the specific solution adopted, in one or more embodiments holes 140 may have diameter dimensions amounting to a few millimeters, and be separated by a distance approximately amounting to the kiss cuts 142 extending e.g. between adjacent holes 140.

Figure 14:
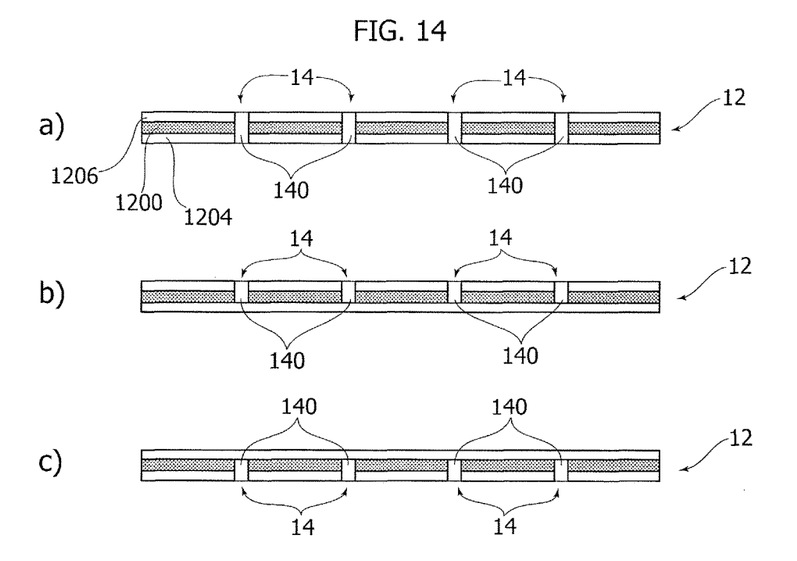
FIG. 14, including three parts respectively denoted as a), b) and c), shows various implementations of embodiments.

In one or more embodiments, as exemplified in FIG. 14, holes 140 may extend through the metallic core layer 1200 and through one or both of base layer 1204 and cover layer 1206.

Kiss cuts 142 may be present in one or both external layers 1204, 1206.

Figure 1:
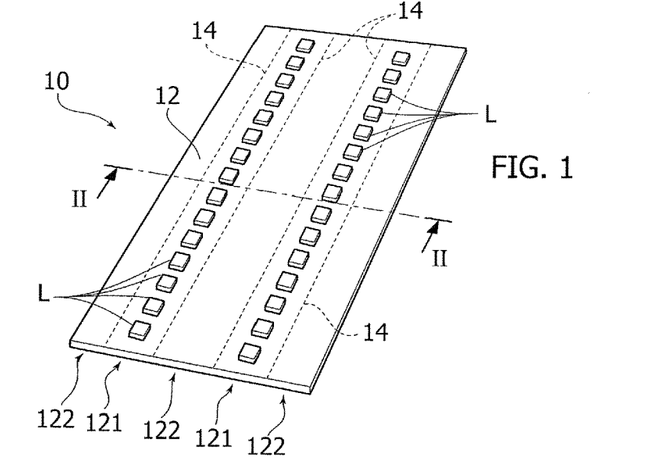
FIG. 1 generally shows a lighting device employing electrically-powered solid-state light radiation sources, e.g. LED sources.
Figures 15, 16:
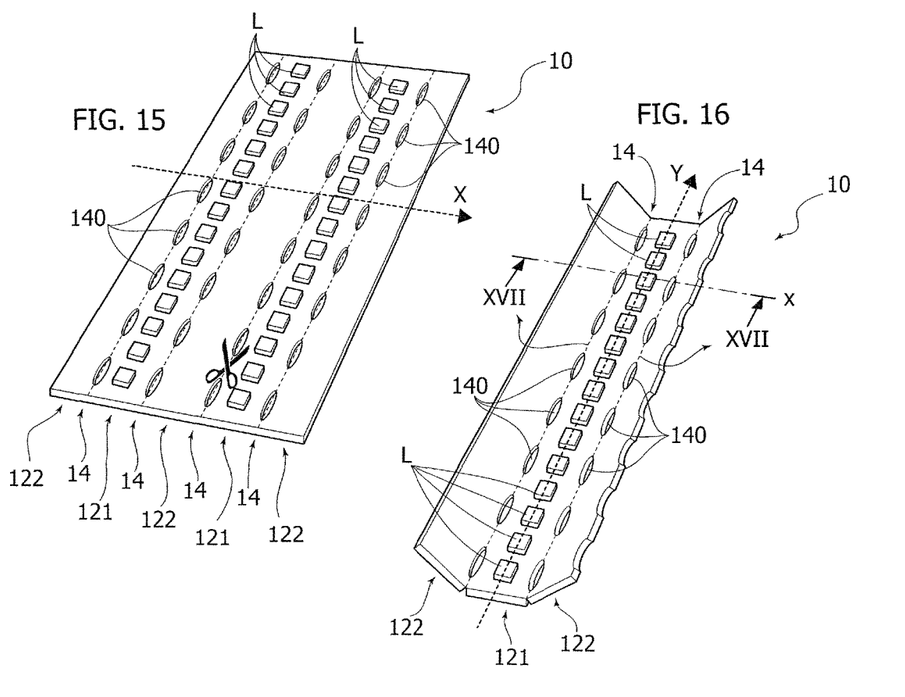
FIG. 15 exemplifies possible uses of one or more embodiments.
FIGS. 16 and 17, the latter including two parts respectively denoted as a) and b) and substantially corresponding to a cross-section view along line XVII-XVII of FIG. 16, show possible uses of one or more embodiments.

FIG. 15 and following show various possible applications of a lighting device corresponding to the embodiments exemplified in FIG. 12 (which, as it will be appreciated, correspond to the more general model shown in FIG. 1).

In this regard it will be appreciated that, in one or more embodiments, lighting devices 10 exemplified in figures such as FIG. 1, FIG. 10 or FIG. 12 may be seen as elements having an indefinite length, i.e. adapted to be wound up in a roll or reel, e.g. with their winding axis being transverse to the common extension direction of bending lines 14. Such a roll may then be unwound, e.g. by the installer or by the final user, and cut to length, in such a way as to originate a device 10 which, according to the application needs, has a size and features (e.g. the number of LEDs) which correspond to the requirements.

FIG. 15 exemplifies the possibility of dividing a device as shown in FIG. 12 via a cutting operation performed in the length direction (i.e. along axis y, perpendicular to axis x) along one of bending lines 14, e.g. along the third bending line 14 from the left, which can be seen in device 10 shown in FIG. 12 and FIG. 15.

Figures 18, 19:
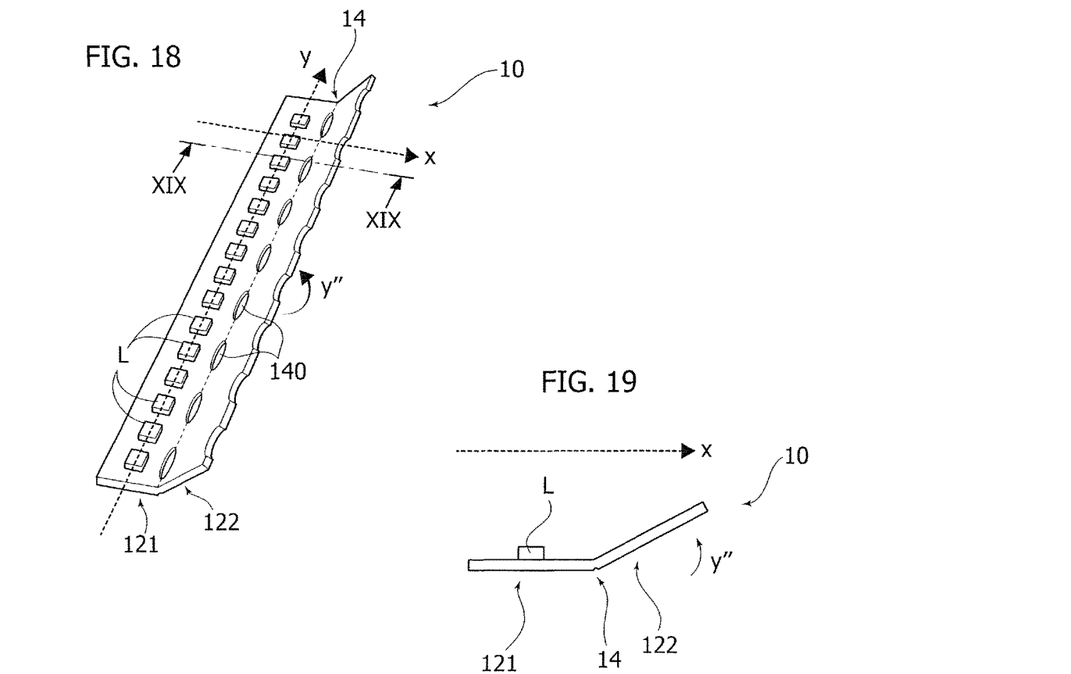
FIG. 18 shows still further possible uses of one or more embodiments.
FIG. 19 is a cross-section view along line XIX-XIX of FIG. 18.

In this way, the starting device (FIG. 12) may be divided into two devices, the former shown in FIG. 16 and the latter shown in FIG. 18, adapted to be used in different ways.

For example, the first device 10 obtained through a cutting operation (as shown in FIG. 16) may be subjected to bending along both bending lines 14 provided therein, so as to impart it a general channel-like shape, e.g. with the LEDs L facing towards the interior of the channel-like shape.

Figure 17:
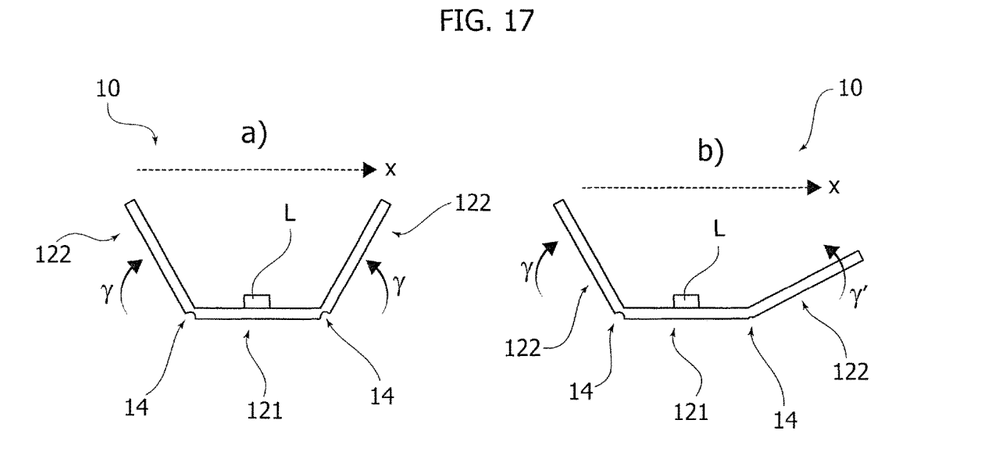

This is schematically shown in the parts a) and b) of FIG. 17.

Said figures exemplify the possibility of performing the channel-shaped bending operations both symmetrically (with both "wings" 122 being bent by the same angle γ with respect to the functional stripe or band 121 comprised therebetween, on which LEDs L are arranged) and asymmetrically (each wing 122 being bent, with respect to the central functional part 121, by different angles γ and γ').

In the first case (part a) in FIG. 17), the distribution of the light radiation emitted by device 10 will be substantially symmetrical both in direction x and in direction y. There is a cutoff in the direction of axis x (due to the wall effect performed by wings 122), while in direction y the final distribution will be basically determined by the distribution of the light radiation emission from the LEDs L.

The possibility of obtaining a cutoff in the distribution of light radiation emission may be appreciated in indoor lighting applications, e.g. in office lighting, because it enables a reduction in the glare.

In the exemplary case shown in part b) of FIG. 17 (mutually different bending angles γ, γ'), the resulting distribution of light radiation emission will be symmetrical along axis y and asymmetrical in the direction of axis x, with different cutoff angles on both sides of device 10 in the direction of axis x.

Such an asymmetrical distribution, having a different cutoff angle on each side, may be useful and appreciated in lighting applications such as "wall-wash" lighting.

In any case, the cutoff action on the distribution of light radiation emission arises for angle values which are the more reduced, the wider the bending angle γ (and γ').

The other device obtained through the cutting operation exemplified in FIG. 15, i.e. the device shown in FIG. 18, may in turn be subjected to a bending operation along bending line 14 according to an angle γ'', originating a distribution of light radiation emission which is symmetrical in the direction of axis y and asymmetrical in the direction of axis x (with respect to the lying plane of functional stripe or band 121, whereon LEDs L are mounted).

Such angle distribution will exhibit a cutoff angle in the direction of axis x (on the right of the viewing point of FIG. 19), the value of the cutoff angle depending on the bending angle γ''. In this case, as well, it is a distribution of the light radiation emission which can be valued in applications such as a "wall-wash" lighting.

Figure 20:
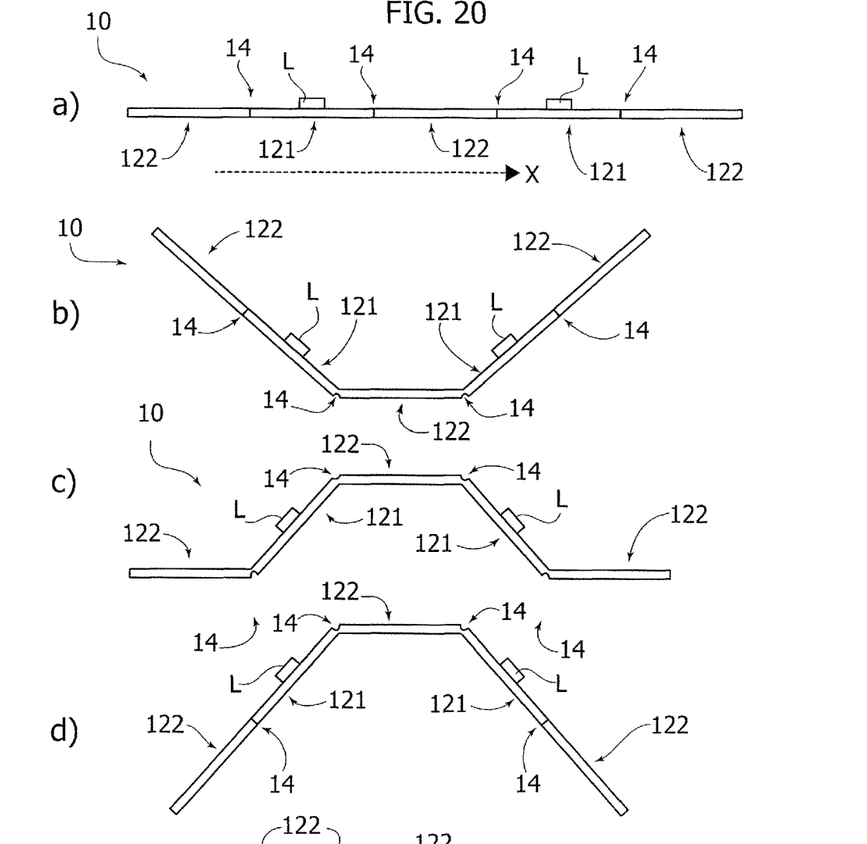
FIG. 20, including four parts respectively denoted as a), b), c) and d) shows various possible uses of one or more embodiments.

The four parts of FIG. 20, respectively denoted as a), b), c) and d), show possible uses of a lighting device as exemplified in FIG. 12, in the case of omission of the cutting operation exemplified in FIG. 15.

In this case a device 10 will be obtained having five stripes or bands, including two functional stripes or bands 121, carrying LEDs L, separated by a central wing 122 and flanked by two external wings 122.

In this case symmetrical bending operations may be carried out so that device 10 obtains:

- a channel-like shape, both functional stripes or bands being bent with respect to central wing 122, so that LEDs L are turned towards the inside of the channel-shaped configuration, both outer wings 122 being adapted to form the distal edges of the sides of the channel-shaped configuration; see part b) of FIG. 20;

- a configuration wherein functional stripes or bands 121 are bent with respect to central wing 122 so that LEDs L face towards the exterior of the channel-shaped arrangement, outer wings 122 being adapted once again to form the distal branches or portions of the channel-shaped configuration: see part c) of FIG. 20, or

- a so-called "mesa-like" configuration, wherein both stripes or bands 121 are once again bent with respect to central wing 122, so that LEDs L are turned towards the exterior of the channel-like configuration, and the external wings 122 are in turn bent with respect to functional stripes or bands 121, so as to complete said mesa-like configuration: see part d) of FIG. 20.

Of course, the solutions exemplified in FIG. 20 are only a few possible solutions adopted to implement device 10.

Other bending configurations may include, for example, the generally arcuate shape exemplified in FIG. 9, or alternatively modifications of the solutions exemplified in FIG. 20, e.g. so as to create asymmetrical transverse profiles, instead of the symmetrical profiles exemplified in FIG. 20.

Such bending solutions may be useful/valuable e.g. in applications in area lighting, or in omnidirectional back lighting.

Figure 21:
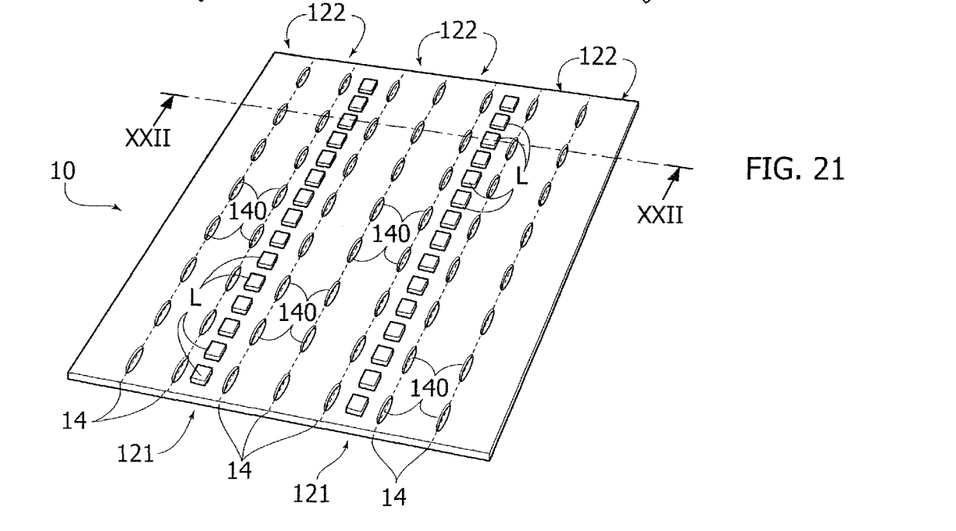
FIG. 21 exemplifies further possible embodiments.

FIG. 21 exemplifies the possibility, in one or more embodiments, of the alternation between functional stripes or bands 121 and wings 122 assuming different characteristics than the "one-to-one" alternation exemplified in the previous figures.

For example, FIG. 21 refers to a device 10 including two functional stripes or bands 121, being separated by two central wings 122, in a device 10 which again includes, on both sides of device 10, two external wings 122.

Of course, in this case as well, bending lines 14 may be implemented according to the previously exemplified criteria, and are adapted to be used for cutting device 10 so that it is possible to obtain a plurality of devices from one single device (which may have the shape of a ribbon which may cut to length).

For example, device 10 exemplified in FIG. 21 may be cut along the central bending line and in this way originate two devices 10, each exhibiting a functional stripe or band 121 flanked on both sides by one or two wings 122.

Figure 22:
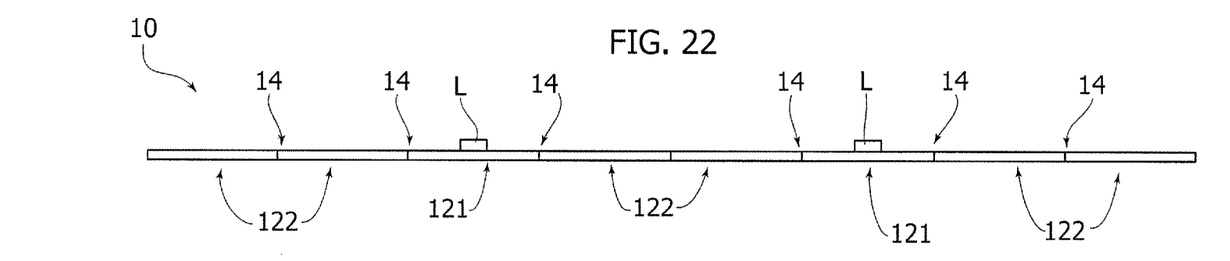
FIG. 22 is a cross-section view along line XXIII-XXIII in FIG. 21.

FIG. 22 to FIG. 26 exemplify further options for bending a device 10 as exemplified in FIG. 21, starting from the flat configuration exemplified in FIG. 22.

Figure 23:
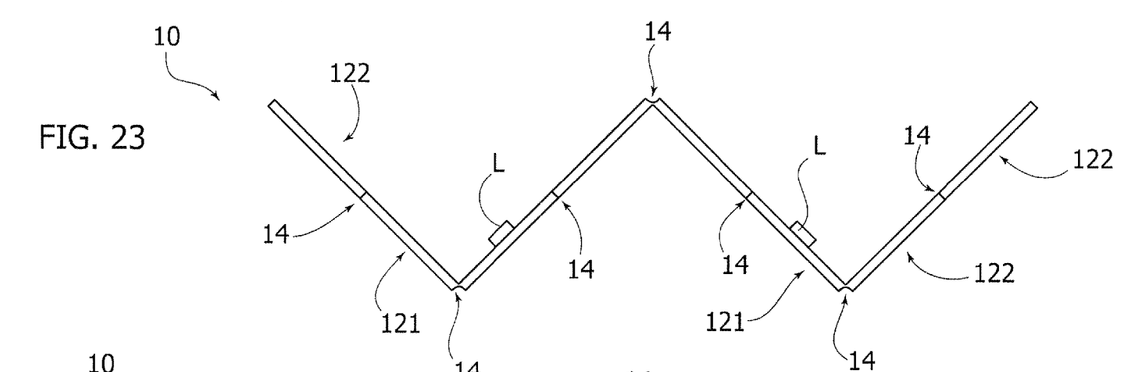
FIGS. 23 to 26 exemplify possible uses of one or more embodiments as exemplified in FIG. 21.

For example, FIG. 23 shows the possibility of bending device 10 according to a generally W-shaped transverse profile, which may be considered as the union (along central bending line 14) of two V-shaped channel profiles, each including two pairs of stripes or bands, wherein one of the stripes or bands adjacent the bottom of the V-shape is a functional stripe or band 121 carrying LEDs L.

Figure 24:
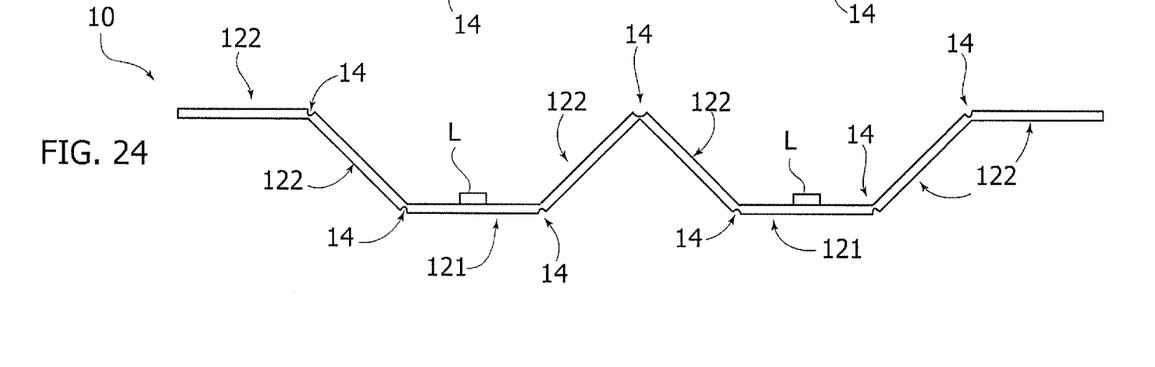

FIG. 24 exemplifies a further bending option according to a general W-shape, which again gives rise to two channel-shaped elements which are connected to each other at the central bending line 14, each of such channel-shaped elements including a functional stripe or band 121 carrying LEDs L which lies in a central position with respect to the channel-like shape, and which is flanked by two wings 122, with the addition, on the external sides of the structure, of two further wings 12 extending in the direction of the lying plane of functional stripes or bands 121.

Figure 25:
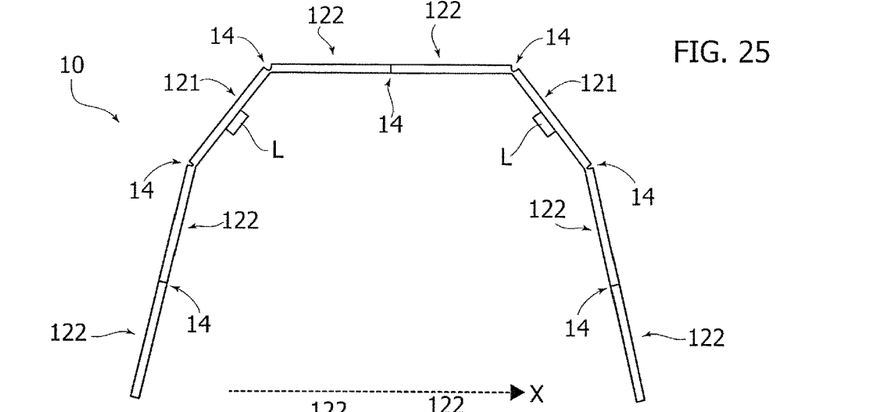
Figure 26:
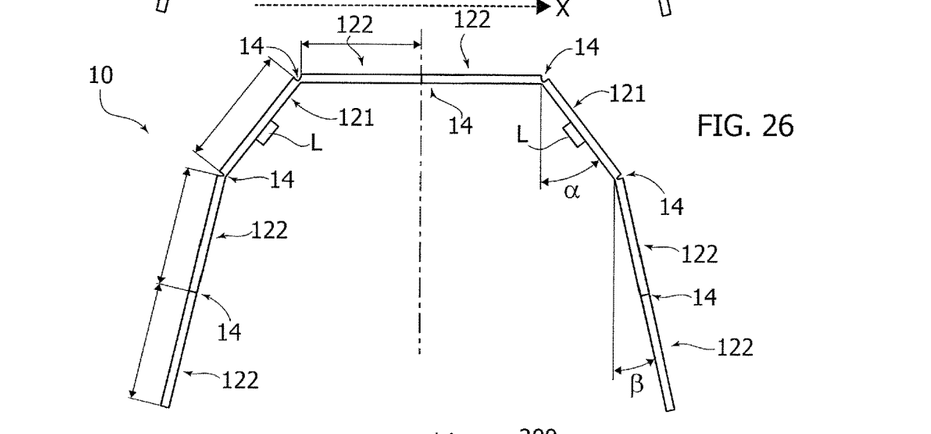

FIG. 25 and FIG. 26 exemplify the possibility of subjecting a device 10, as exemplified in FIG. 21, to a bending according to a channel-shape, which may originate a complex form such as a "trumpet-flower" profile, which recalls the profile of a paraboloidal reflector, wherein the bottom region is identified by two coplanar wings 122, with two functional stripes or bands 121 adjacent said bottom wall and carrying LEDs L facing towards the interior of the trumpet-flower shape; moreover, on both sides of the trumpet-flower shape, a pair of wings 122 finish off the trumpet-flower profile.

FIG. 26 exemplifies the possibility of acting on the dimensions a, b, c, d of the various stripes or bands 121, 122, for example by choosing value a so that it is smaller than values c and d. The possibility is moreover given of acting on the shaping of device 10 through the values of angles α and β, defining the angle formed (with respect to the normal to wings 122 located on the bottom plane of the trumpet-flower profile) by functional stripes or bands 121 carrying LEDs L and by wings 122 located on the outside of the trumpet-flower shape.

Solutions as exemplified in FIGS. 23 to 26 allow for various shapings of the distribution of light radiation emitted by device 10. For example, the solutions exemplified in FIG. 25 and FIG. 26 achieve a rather sharp cutoff angle along direction x, so as to reach a UGR (Unified Glare Rating) in the direction x which may be lower than 19.

Figure 27:
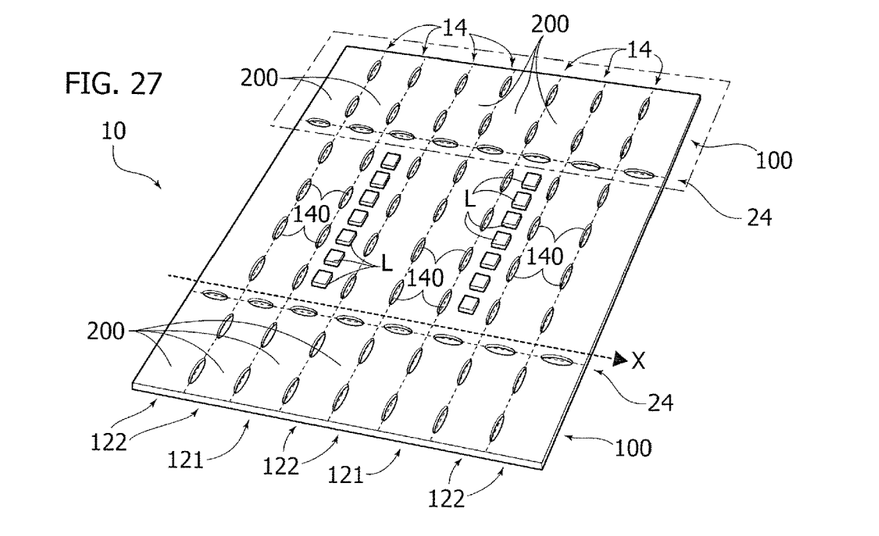
FIGS. 27 and 28 show still further embodiments.

FIG. 27 exemplifies the possibility, in one or more embodiments, of integrating one or two end portions 100, which may be defined as flange portions, into a device 10 structured as exemplified in FIG. 21 (it will be appreciated, however, that such a possibility is also given for structures as exemplified in FIG. 12 and FIG. 15).

In one or more embodiments, such flange portions are extensions of stripes or bands 121, 122, which are practically similar to wings 122 (because flanges 200 do not carry LEDs L), the flange portion(s) 100 being separated from base structure 10 by further bending lines 24 extending in the direction of axis x, i.e. transverse of the common extension direction of bending lines 14.

In one or more embodiments, bending lines 24 are adapted to be implemented in a similar way to what has been exemplified for bending lines 14.

In one or more embodiments, flange portions 100 are adapted to be cut along bending lines 14 starting from their distal ends up to bending line 24.

In this way, at both ends (or optionally only at one end) of device 10, flanges/flaps may be obtained which, when device 10 is e.g. bent in channel shape (e.g. with the LEDs L facing towards the interior of the channel) may be folded towards the interior of the channel and then may be connected (e.g. with a drop of glue), so as to keep device 10 closed according to a general channel shape, said closing flaps comprised by flanges 100 forming end walls of device 10, which therefore obtains an overall bowl-shaped configuration.

Figure 28:
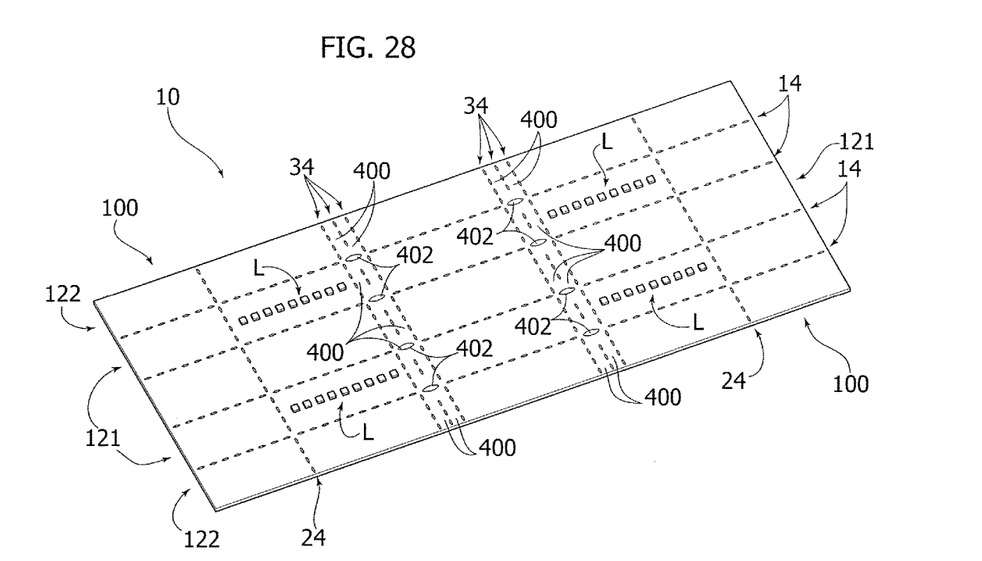

Such a criterion may be further extended, as exemplified in FIG. 28, by introducing further bending lines 34 which extend (again in direction x, i.e. transversally of the common extension direction of bending lines 14) so as to form intermediate flanges 400 of stripes 121 and 122, e.g. separated by slots 402 formed in support member 10 e.g. via punching or cutting operations.

Figure 29:
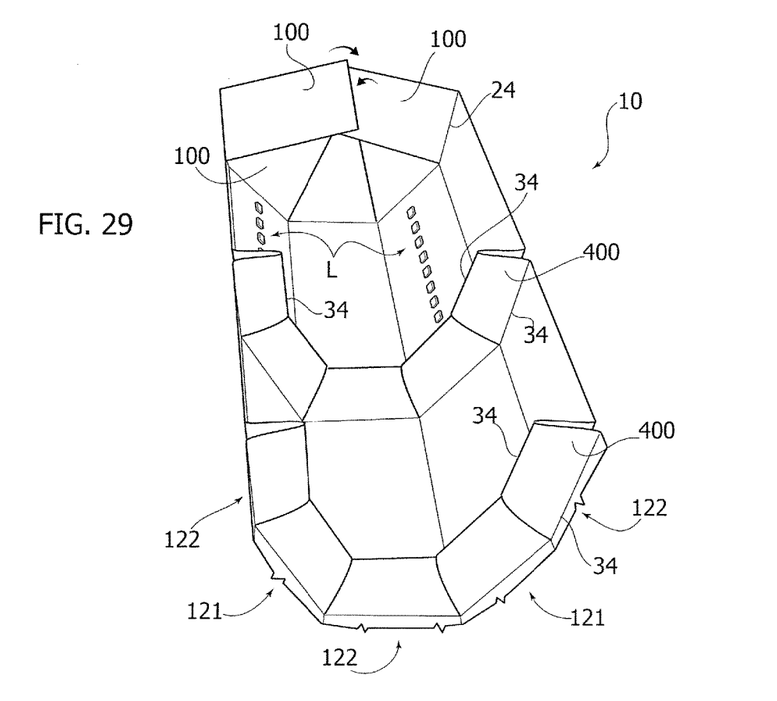
FIG. 29 exemplifies possible uses of embodiments as exemplified in FIG. 28.

Flanges 400 may be folded "bellows-like" along bending lines 34, as schematically shown in FIG. 29, so as to form ribs which project within the channel-shaped configuration and constitute a "partitioning" of device 10, thereby performing a masking action of the light radiation emitted bay LEDs L according to specific angles, e.g. to limit glare by reducing UGR.

Flanges (both flanges 100 and flanges 400) achieve a cutoff of the light radiation emission in direction y. This possibility may be appreciated especially in indoor lighting (e.g. office lighting) because it may reduce UGR to a value e.g. lower than 19 in the directions of both axis X and axis Y.

For clarity of illustration, it will be appreciated that, in order not to complicate the graphical representation, the possible presence of bending lines 34 and of flanges 400 has been exemplified in FIG. 28 and FIG. 29 while referring to a structure that is substantially similar to device 10 of FIG. 12 and FIG. 15 (five stripes or bands 121, 122) instead of eight stripes or bands 121, 122 of the device in FIG. 27.

One or more embodiments may therefore concern a lighting device 10 including a laminar support member 12 adapted to be bent at bending lines 14 extending in a common direction (axis y), such bending lines 14 partitioning laminar support member 12 in a plurality of stripes 121, 122, including at least one first stripe 121 carrying electrically-powered light radiation sources L therealong, and at least one second stripe 122 being free from light radiation sources and forming a side wing for said at least one first stripe 121.

One or more embodiments may include a plurality of said first stripes 121 carrying a plurality of electrically-powered light radiation sources L therealong, said at least one second stripe 122 being free from light radiation sources, being located between first stripes 121 of said plurality of first stripes.

One or more embodiments may include a plurality of said first stripes 121 and a plurality of said second stripes 122, which may be arranged in an alternate sequence (one-to-one or other) with respect to said first stripes of said plurality of first stripes 121.

In one or more embodiments, light radiation sources L on first stripes 121 may be arranged on the same surface of said laminar support member 12.

In one or more embodiments (see for instance FIG. 27 to FIG. 29) laminar support member 12 may include at least one further bending line 24, 34 extending transversally (axis x) of said common direction (axis y) of bending lines 14, with flange portions 100, 400 of said at least one first stripe 121 and said at least one second stripe 122 adjacent said at least one further bending line 24, 34; said flange portions 100, 400 being bendable with respect to said at least one first stripe 121 and said at least one second stripe 122 at said at least one further bending line 24, 34, in order to form transverse flanges of said lighting device (10).

In one or more embodiments (see again, e.g., FIG. 27 to FIG. 29), lighting device 10 may include at least one of:
- a pair of further bending lines 24, extending transversally of said common direction at both ends of said at least one first stripe 121 and of said at least one second stripe 122, with opposed flange portions 100 at both ends of said at least one first stripe 121 and of said at least one second stripe 122, being bendable with respect to said at least one first stripe 121 and said at least one second stripe 122, in order to form transverse terminal flanges of said lighting device 100,
- one (or more) groups of e.g. three further bending lines 34, extending transversally of said common direction in an intermediate position of said at least one first stripe 121 and said at least one second stripe 122, said group of further bending lines 34 defining intermediate flanges 400 of said at least one first stripe 121 and of said at least one second stripe 122, said intermediate flanges 400 being bendable e.g. in a bellows-like shape with respect to said at least one first stripe 121 and said at least one second stripe 122 in order to form an intermediate flange 400 of said lighting device 10.

In one or more embodiments, said bending lines 14, 24, 34 may include rows of blind or through holes 140 in said laminar support member 12 and, preferably, kiss cuts 142 on the surface of said laminar support member 12.

In one or more embodiments, said laminar support member 12 may include a metallic core layer 1200, sandwiched between a base layer 1204 and a cover layer 1206, said blind or through holes 140 extending across said metallic core layer 1200 and across at least one of said base layer 1204 and said cover layer 1206.

In one or more embodiments, said cover layer 1206 may include a reflective material.

In one or more embodiments, said holes 140 may have a longer dimension (see e.g. "a" in FIG. 13) in the direction of the respective bending line 14, 24, 34.

One or more embodiments may concern a method of producing a lighting device 10, the method including providing a laminar support member 12 having bending lines 14 extending in a common direction, said bending lines 14 partitioning said laminar support member 12 in a plurality of stripes 121, 122, wherein said plurality of stripes include at least one first stripe 121 with electrically-powered light radiation sources (L) therealong and at least one second stripe (122) free from light radiation sources forming a side wing for said at least one first stripe 121.

In one or more embodiments, said laminar support member 12 may be wound up as a roll having a winding axis transverse said common direction of said bending lines 14.

Of course, without prejudice to the basic principles, the implementation details and the embodiments may vary, even appreciably, with respect to what has been described herein by way of non-limiting example only, without departing from the extent of protection.

One or more embodiments aim at satisfying the previously outlined need.

According to one or more embodiments, a lighting device is provided having the features specifically set forth in the claims that follow.

One or more embodiments may also concern a corresponding method.

The claims are an integral part of the technical teaching provided herein with reference to the embodiments.

One or more embodiments result in a lighting device adapted to achieve high functionality levels with the low costs which are typical of light emitting diode (LED) modules.

Devices according to one or more embodiments may be wound up as rolls, adapted to be shipped in this form to the installer/end user, offering the latter the possibility of easily obtaining the desired application solutions.

One or more embodiments may achieve a high reflectivity (for example >94%) with a consequent high degree of efficiency.

One or more embodiments may achieve a lighting device that, beside its proper function (light engine) may also perform additional optical functions, for example due to the presence of a cover layer and/or a base layer.

One or more embodiments may impose less strict requirements than those connected e.g. to a metal body.

One or more embodiments may unite into one single element the three previously mentioned components (base body, light engine and diffusers/secondary optics), while leaving a wide freedom of choice as regards final solutions.

One or more embodiments enable the implementation of modular structures, adapted to satisfy various application needs (e.g. a distributed "wall-washing" lighting, area lighting, etc.) with a single structure, e.g. thanks to slots or cuts which enable cutting out, from a roll or reel, panels which may then be shaped according to the intended final application.

In one or more embodiments, the use of through and/or blind cuts, optionally so called "kiss cuts", i.e. partial cuts having the thickness of a panel element, e.g. a polymeric element, enables bending at room temperature, while permanently retaining the given shapes. In this way, the installer/final user may easily shape the lighting modules, even at the installation site.

One or more embodiments may moreover offer advantages as regards weight and cost reduction, both in production and packaging, storing and shipping.

One or more embodiments may find application in various fields of lighting technology, including automotive and medical applications.

One or more embodiments enable the production of lighting devices starting from a laminar base structure (practically a sheet) which is bent according to a technique similar to the Origami Design. This may lead to significant savings in the implementation of different shapes and sizes, including the possibility of integrating, partially or completely, diffusers into the lighting device.

From the point of view of implementation, one or more embodiments may be based on the manufacturing processes of traditional Flexible Printed Circuits (FPCs), while offering the installer/end user the option to decide the final shape of the device according to his own taste and needs, and to obtain that shape with operations which may also be performed at the installation site.

To sum up, one or more embodiments may offer one or more of the following effects:
- the lighting device may be a complete luminaire, thus avoiding the use of secondary optics components such as lenses and reflectors; however, for example, the presence of a frame, e.g. a metal frame, may be envisaged;
- the possibility is given of implementing modular structures for various applications, such as "wall-washing" lighting, area lighting and a wide range of indoor lighting solutions, which may be implemented with a single modular structure;
- the manufacturing is simplified, also thanks to the possible use of cuts (total or partial cuts, so called "kiss cuts"), while the possibility is given of bending the device at room temperature and of shaping the device even at the installation site;
- packaging and handling are simplified, having the possibility of storing and shipping the device in the form of rolls or reels;
- costs are reduced thanks to factors such as: i) modular design, ii) simplified bending and shaping, iii) the possible packaging as rolls or reels of flexible material, and moreover iv) light weight, with the consequent possibility of reducing shipping and handling costs.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A lighting device, comprising:
a laminar support member bendable at at least one bending line extending in a common direction, said at least one bending line partitioning said laminar support member in a plurality of stripes,
wherein said plurality of stripes comprises at least one first stripe with electrically-powered light radiation sources therealong and at least one second stripe free from light radiation sources forming a side wing for said at least one first stripe;
wherein said laminar support member includes at least one further bending line extending transversally of said common direction of said at least one bending line with flange portions of said at least one first stripe and said at least one second stripe adjacent said at least one further bending line, said flange portions bendable with respect to said at least one first stripe and said at least one second stripe at said at least one further bending line to form a transverse flange of said lighting device;
and at least one of:
said at least one further bending line comprises a pair of further bending lines extending transversally of said common direction at both ends of said at least one first stripe and said at least one second stripe with opposed flange portions at both ends of said at least one first stripe and said at least one second stripe bendable with respect to said at least one first stripe and said at least one second stripe to form terminal transverse flanges of said lighting device,
a set of further bending lines extending transversally of said common direction intermediate said at least one said first stripe and said at least one second stripe, said set of further bending lines defining intermediate flanges of said at least one first stripe and said at least one second stripe, said intermediate flanges bendable with respect to said at least one first stripe and said at least one second stripe to form an intermediate flange of said lighting device;
wherein said at least one bending line and further bending lines including lines of blind or through holes or lines of blind or through cuts.

2. The lighting device of claim 1, further comprising:
a plurality of said first stripes with electrically-powered light radiation sources therealong, with at least one said second stripe free from light radiation sources between the first stripes of said plurality of first stripes.

3. The lighting device of claim 1, further comprising:
a plurality of said first stripes and a plurality of said second stripes arranged in alternate sequence to said first stripes of said plurality of first stripes.

4. The lighting device of claim 2,
wherein said light radiation sources of said first stripes are at a same surface of said laminar support member.

5. The lighting device of claim 1,
wherein said at least one bending line include lines of blind or through holes in said laminar support member.

6. The lighting device of claim 1,
wherein said at least one bending line include cuts of the kiss cut type at the surface of said laminar support member.

7. The lighting device of claim 5,
wherein said laminar support member includes a metallic core layer sandwiched between a base layer and a cover layer, and
wherein said blind or through holes extend through said metallic core layer and at least one of said base layer and said cover layer.

8. The lighting device of claim 7,
wherein said cover layer comprises a reflective material.

9. The lighting device of claim 5,
wherein said holes have a longer dimension in the direction of the respective bending line.

10. A method of producing a lighting device, the method comprising:
providing a laminar support member having at least one bending line extending in a common direction, said at least one bending line partitioning said laminar support member in a plurality of stripes, wherein said plurality of stripes includes at least one first stripe with electrically-powered light radiation sources therealong and at least one second stripe free from light radiation sources forming a side wing for said at least one first stripe;
providing said laminar support member with at least one further bending line extending transversally of said common direction of said at least one bending line with flange portions of said at least one first stripe and said at least one second strip adjacent to said at least one further bending line,
forming a transverse flange of said lighting device by bending said flange portions with respect to said at least one first stripe and said at least one second stripe at said at least on further bending line; and
at least one of:
said at least one further bending line comprises a pair of further bending lines extending transversally of said common direction at both ends of said at least one first stripe and said at least one second stripe with opposed flange portions at both ends of said at least one first stripe and said at least one second stripe bendable with respect to said at least one first stripe and said at least one second stripe to form terminal transverse flanges of said lighting device,
a set of further bending lines extending transversally of said common direction intermediate said at least one said first stripe and said at least one second stripe, said set of further bending lines defining intermediate flanges of said at least one first stripe and said at least one second stripe, said intermediate flanges bendable with respect to said at least one first stripe and said at least one second stripe to form an intermediate flange of said lighting device;
providing said at least one bending line and further bending lines including lines of blind or through holes or lines of blind or through cuts.

11. The method of claim 10, further comprising:
winding up said laminar support member as a roll with a winding axis transverse said common direction of said at least one bending line.

12. A lighting device, comprising:
a laminar support member bendable at least one bending line extending in a common direction, said at least one bending line partitioning said laminar support member in a plurality of stripes,
wherein said plurality of stripes comprises at least one first stripe with electrically-powered light radiation sources therealong and at least one second stripe free from light radiation sources forming a side wing for said at least one first stripe;
wherein said laminar support member includes at least one further bending line extending transversally of said common direction of said at least one bending line with flange portions of said at least one first stripe and said at least one second stripe adjacent said at least one further bending line, said flange portions bendable with respect to said at least one first stripe and said at least one second stripe at said at least one further bending line to form a transverse flange of said lighting device;

and at least one of:

said at least one further bending line comprises a pair of further bending lines extending transversally of said common direction at both ends of said at least one first stripe and said at least one second stripe with opposed flange portions at both ends of said at least one first stripe and said at least one second stripe bendable with respect to said at least one first stripe and said at least one second stripe to form terminal transverse flanges of said lighting device, a set of further bending lines extending transversally of said common direction intermediate said at least one said first stripe and said at least one second stripe, said set of further bending lines defining intermediate flanges of said at least one first stripe and said at least one second stripe, said intermediate flanges bendable with respect to said at least one first stripe and said at least one second stripe to form an intermediate flange of said lighting device;

said at least one bending line and further bending lines being implemented with modifications to the laminar structure.

* * * * *